United States Patent
Choi

(10) Patent No.: US 9,147,797 B2
(45) Date of Patent: Sep. 29, 2015

(54) SEMICONDUCTOR LIGHT EMITTING DEVICE AND FABRICATION METHOD THEREOF

(75) Inventor: Jin Sik Choi, Gwangju (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 12/881,022

(22) Filed: Sep. 13, 2010

(65) Prior Publication Data

US 2011/0001164 A1    Jan. 6, 2011

Related U.S. Application Data

(63) Continuation of application No. 11/995,447, filed as application No. PCT/KR2006/002916 on Jul. 25, 2006.

(30) Foreign Application Priority Data

Jul. 25, 2005    (KR) .......................... 10-2005-0067181

(51) Int. Cl.
| | | |
|---|---|---|
| *H01L 33/30* | (2010.01) | |
| *H01L 33/00* | (2010.01) | |
| *H01L 33/38* | (2010.01) | |

(Continued)

(52) U.S. Cl.
CPC .......... *H01L 33/0079* (2013.01); *H01L 33/382* (2013.01); *H01L 33/20* (2013.01); *H01L 33/642* (2013.01)

(58) Field of Classification Search
CPC ....... H01L 33/36; H01L 33/38; H01L 33/382; H01L 33/387
USPC ........ 438/46, 42, 43, 47, 44; 257/95, 98, 190, 257/E33.005, E33.006, E33.007, E33.011, 257/E33.064, E33.074
See application file for complete search history.

(56) References Cited

U.S. PATENT DOCUMENTS

| | | | |
|---|---|---|---|
| 5,635,733 A | | 6/1997 | Okagawa et al. |
| 5,696,389 A | | 12/1997 | Ishikawa et al. |
| 5,814,839 A | * | 9/1998 | Hosoba ............................ 257/96 |

(Continued)

FOREIGN PATENT DOCUMENTS

| | | |
|---|---|---|
| CN | 1538537 A | 10/2004 |
| JP | 8-222763 A | 8/1996 |

(Continued)

OTHER PUBLICATIONS

A machine-generated translation is provided for the following reference: JP-2002-16312-A.

*Primary Examiner* — Ermias Woldegeorgis
(74) *Attorney, Agent, or Firm* — Birch, Stewart, Kolasch & Birch, LLP

(57) ABSTRACT

A semiconductor light emitting device according to an embodiment includes a top layer having a top surface and a bottom surface, the top layer being an n electrode; an uneven pattern formed in the bottom surface of the n electrode; an n-type semiconductor layer formed under the n electrode, the n-type semiconductor layer having a top surface and a bottom surface; an uneven pattern formed in the top surface of the n-type semiconductor layer, the uneven pattern of the n-type semiconductor layer corresponding to the uneven pattern of the n electrode; an active layer formed under the n-type semiconductor layer; a p-type semiconductor layer formed under the active layer; and a p electrode formed under the p-type semiconductor layer.

8 Claims, 6 Drawing Sheets

(51) Int. Cl.
*H01L 33/20* (2010.01)
*H01L 33/64* (2010.01)

(56) References Cited

U.S. PATENT DOCUMENTS

| | | | |
|---|---|---|---|
| 5,834,325 | A | 11/1998 | Motoki et al. |
| 6,020,602 | A | 2/2000 | Sugawara et al. |
| 6,091,085 | A | 7/2000 | Lester |
| 6,376,864 | B1 | 4/2002 | Wang |
| 6,492,661 | B1 | 12/2002 | Chien et al. |
| 6,495,862 | B1 | 12/2002 | Okazaki et al. |
| 6,555,405 | B2 | 4/2003 | Chen et al. |
| 6,825,056 | B2 | 11/2004 | Asakawa et al. |
| 6,870,191 | B2 | 3/2005 | Niki et al. |
| 7,012,279 | B2 | 3/2006 | Wierer, Jr. et al. |
| 7,233,028 | B2 | 6/2007 | Weeks et al. |
| 7,560,294 | B2 | 7/2009 | Suehiro et al. |
| 2002/0195609 | A1* | 12/2002 | Yoshitake et al. ............. 257/81 |
| 2003/0111658 | A1* | 6/2003 | Nakamura et al. ............ 257/10 |
| 2003/0173602 | A1 | 9/2003 | Hsu et al. |
| 2003/0222263 | A1 | 12/2003 | Choi |
| 2004/0173805 | A1* | 9/2004 | Lai et al. .................. 257/94 |
| 2004/0206969 | A1 | 10/2004 | Orita |
| 2005/0082545 | A1 | 4/2005 | Wierer, Jr. et al. |
| 2005/0082546 | A1 | 4/2005 | Lee et al. |
| 2005/0104081 | A1 | 5/2005 | Kim et al. |
| 2006/0011923 | A1* | 1/2006 | Eisert et al. ................ 257/77 |
| 2006/0054907 | A1* | 3/2006 | Lai .......................... 257/96 |
| 2006/0234408 | A1 | 10/2006 | Lee et al. |
| 2006/0273341 | A1 | 12/2006 | Lee et al. |

FOREIGN PATENT DOCUMENTS

| | | |
|---|---|---|
| JP | 1999-274568 A | 10/1999 |
| JP | 2000-196152 A | 7/2000 |
| JP | 2002-16312 A | 1/2002 |
| JP | 2002-222773 A | 8/2002 |
| KR | 10-2005-0013048 A | 2/2005 |
| TW | 448589 B | 8/2001 |

* cited by examiner

SEMICONDUCTOR LIGHT EMITTING DEVICE AND FABRICATION METHOD THEREOF

CROSS REFERENCE TO RELATED APPLICATIONS

This application is a continuation of co-pending U.S. application Ser. No. 11/995,447 filed Jan. 11, 2008, which was the national phase application of PCT/KR2006/002916, filed Jul. 25, 2006, the contents of each are hereby incorporated by reference.

FIELD OF THE INVENTION

The present invention relates to a semiconductor light emitting device and a fabrication method thereof.

BACKGROUND OF THE INVENTION

In general, a semiconductor light emitting device, for example, a light emitting diode, has a stack structure in which an n-type semiconductor layer, a light emitting region, and a p-type semiconductor layer are stacked on a substrate. An electrode is formed on the p-type semiconductor layer and the n-type semiconductor layer. As an electron injected from the semiconductor layer recombines a hole, light is generated from the light emitting region. The light generated from the light emitting region is emitted from a light-transmittable electrode on the p-type semiconductor layer or from the substrate. Here, the light-transmittable electrode on an almost entire surface of the p-type semiconductor layer is a light-transmittable electrode formed of a thin metal layer or a transparent conductive layer.

The color (i.e., wavelength) of light emitted from the light emitting diode is determined depending on a semiconductor material used to manufacture the light emitting diode. This is because the wavelength of the emitted light corresponds to a band gap of the semiconductor material, which is defined as an energy difference between electrons in the valence band and electrons in the conduction band.

FIG. 1 is an exemplary schematic view showing a structure of a related art semiconductor light emitting device.

As shown in FIG. 1, the related semiconductor light emitting device includes a substrate 11, a buffer layer 12, an n-type cladding layer 13, an active layer 14, a p-type cladding layer 15, a p-type contact layer 16, a p-type electrode 17, and an n-type electrode 18.

Because the stack structure of the semiconductor light emitting device is controlled at the atomic level, substrate processing is performed to provide the substrate with flatness of a mirror surface. Thus, the semiconductor layers 12, 13 and 15, the active layer 14, and the electrodes 17 and 18 are stacked on the substrate 11 parallel to one another.

The semiconductor layer has a great refractive index, and a waveguide is constructed by a surface of the p-type cladding layer 15, and a surface of the substrate 11. Accordingly, when light is incident upon a surface of the p-type electrode 17 or a surface of the substrate 11 at a predetermined critical angle or greater, the incident light is reflected by an interface between the p-type electrode 17 and the p-type cladding layer 15, or by the surface of the substrate 11, and propagates through the inside of the stack structure of the semiconductor layers in a horizontal direction. During such propagation, light is confined within the waveguide and may be lost. For this reason, external quantum efficiency cannot be achieved as much as expected.

As one method to eliminate aforementioned defections and improve the external quantum efficiency, a semiconductor light emitting device as illustrated in FIG. 2 has been proposed. FIG. 2 is a schematic view showing a different example of the related art semiconductor light emitting device.

As shown in FIG. 2, the improved semiconductor light emitting device includes a substrate 21, a buffer layer 22, an n-type cladding layer 23, an active layer 24, an p-type cladding layer 25, a p-type contact layer 26, a p-type electrode 27, and an n-type electrode 28.

As compared to the related art semiconductor light emitting device illustrated in FIG. 1, the substrate 21 of the improved semiconductor light emitting device has a top surface with uneven patterns. The buffer layer 22 is formed on the uneven surface of the substrate 21, and the n-type cladding layer 23 is stacked thereon.

In the semiconductor light emitting device having the flat substrate illustrated in FIG. 1, when light propagates in the semiconductor layer in the horizontal direction, a portion of the light is absorbed into the semiconductor layer or the electrode, which causes attenuation of light coming out of the semiconductor layer.

In comparison, as for the improved semiconductor light emitting device illustrated in FIG. 2, light propagating in the horizontal direction is scattered or diffracted. Thus, light can be efficiently emitted from the upper semiconductor layers 22, 23, 24 and 25 or from the lower substrate 21, contributing to improving the external quantum efficiency.

In the case of the improved semiconductor light emitting device illustrated in FIG. 2, injected carriers move on surfaces and interfaces, thereby generating electrical conductivity. A high drive voltage applied within a predetermined area for the light emission allows a large amount of injected carriers (electrons) to flow. Here, a current flows through a thin layer of the n-type cladding layer 23 located under the n-type electrode 28. A current density-concentrated region is located closely to the n-type electrode 28.

In this region, current crowding occurs, which makes the current density relatively high. When such a region where the current distribution is concentrated is generated, a temperature drastically increases. Then, generated heat lowers the light emitting efficiency, and consequently, reliability of a device is reduced in the long run.

Also, the proximity of the two electrodes makes the semiconductor light emitting device vulnerable to static electricity. Because the substrate is an insulating substrate, thermal dissipation is not improved even if a heat sink is attached to the substrate.

Therefore, research is made on a semiconductor light emitting device that can improve the external quantum efficiency and the thermal dissipation.

The present invention provides a semiconductor light emitting device and a fabrication method thereof that can improve external quantum efficiency and thermal dissipation.

SUMMARY OF THE INVENTION

The present invention provides a semiconductor light emitting device. The semiconductor light emitting device includes a first semiconductor layer having a bottom surface with uneven patterns; an active layer formed on the first semiconductor layer; a second semiconductor layer formed on the active layer; a second electrode formed on the second semiconductor layer; and a first electrode formed under the first semiconductor layer.

The present invention provides a method for fabricating a semiconductor light emitting device, the method includes forming a first semiconductor layer on a substrate; forming an active layer on the first semiconductor layer; forming a second semiconductor layer on the active layer; removing the substrate; forming uneven patterns on the first semiconductor layer; and forming a first electrode on the first semiconductor layer, and forming a second electrode on the second semiconductor layer.

According to the present invention, external quantum efficiency and thermal dissipation may be improved.

DETAILED DESCRIPTION OF THE PREFERRED EMBODIMENTS

It will be understood that when a substrate, a layer (film), a region, a pattern, or a structure are referred to as being "on/above/over/upper" or "down/below/under/lower" another substrate, layer, region, pad or pattern, they can directly contact the other substrate, layer, region, pad or pattern, or intervening layers, regions, pads, patterns or structures may also be present. The meaning must be understood based on the technical concept of the present invention.

An embodiment of the present invention will now be described in detail with reference to accompanying drawings.

Figure 1:
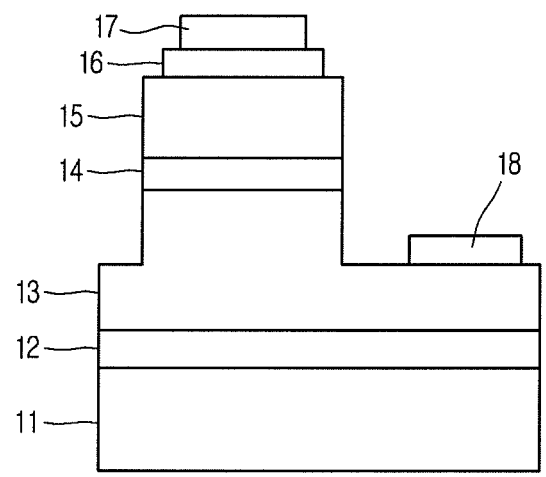
FIG. 1 is a schematic view showing one example of a structure of a related art semiconductor light emitting device.
Figure 2:
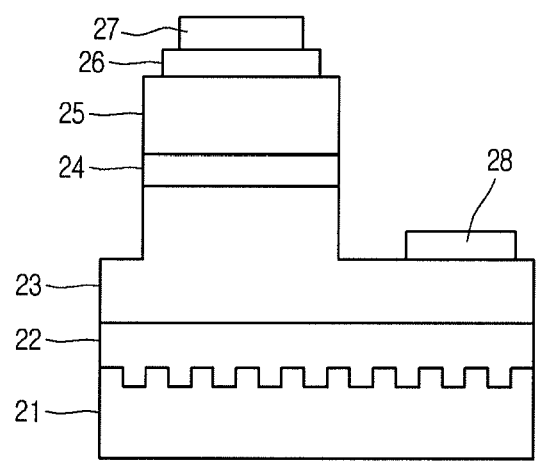
FIG. 2 is a schematic view showing another example of a structure of the related art semiconductor light emitting device.
Figure 3:
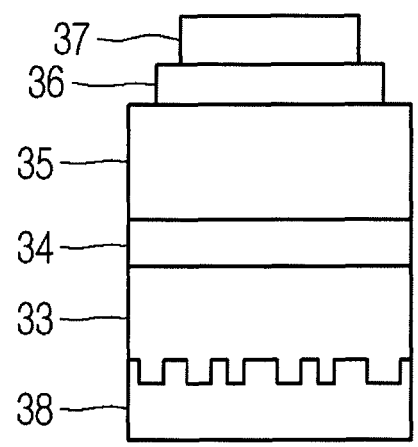
FIG. 3 is a schematic view showing a structure of a semiconductor light emitting device according to the present invention.

FIG. 3 is a schematic view showing a structure of a semiconductor light emitting device according to the present invention.

As illustrated in FIG. 3, the semiconductor light emitting device according to the present invention includes an n-type cladding layer 33 having a bottom surface with uneven patterns, an active layer 34 formed on the n-type cladding layer 33, and a p-type cladding layer 35 formed on the active layer 34.

The semiconductor light emitting device according to the present invention may further include a p-type electrode 37 formed on the p-type cladding layer 35, and an n-type electrode 38 formed under the n-type cladding layer 33. A p-type contact layer 36 may be further formed between the p-type cladding layer 35 and the p-type electrode 37.

The n-type cladding layer 33 may be an n-GaN cladding layer, and the p-type cladding layer 35 may be a p-GaN cladding layer. The active layer 34 may have a single quantum well structure or a multi-quantum well structure.

The uneven patterns of the n-type cladding layer 33 may be formed at regular intervals or at different intervals. The n-type electrode 38 may be formed over the entire uneven surface of the n-type cladding layer 33.

The semiconductor light emitting device having such a stack structure according to the present invention has a vertical structure in which the n-type electrode 38 and the p-type electrode 37 are formed at lower and upper parts of the device, respectively. Accordingly, the concentration of the current density near the n-type electrode, which is a problem of a related art planar structure, may be prevented.

That is, in the semiconductor light emitting device according to the present invention, the p-type electrode 37 and the n-type electrode 38 are stacked parallel at upper and lower parts. Accordingly, the current density is not concentrated in a specific region, but may be evenly distributed over an entire region corresponding to the n-type electrode 38. In this manner, the current crowding is prevented from occurring at a specific portion of the n-type electrode 38, thereby preventing a drastic increase in temperature at this specific region.

Also, because the two electrodes are placed at a sufficient distance therebetween in the semiconductor light emitting device according to the present invention, the device has a property that is proof against the static electricity. The thermal dissipation of the semiconductor light emitting device may also be improved by, for example, attaching the device to a heat sink.

In addition, in the semiconductor light emitting device according to the present invention, light propagating in the horizontal direction is scattered or diffracted in the region where the uneven patterns of the n-type cladding layer 33 are formed. Therefore, the external quantum efficiency can be greatly improved.

Then, a process of fabricating the semiconductor light emitting device according to the present invention having such a structure will now be described with reference to FIGS. 4 to 11. FIGS. 4 to 11 are views for describing the process of fabricating the semiconductor light emitting device according to the present invention.

Figure 4:
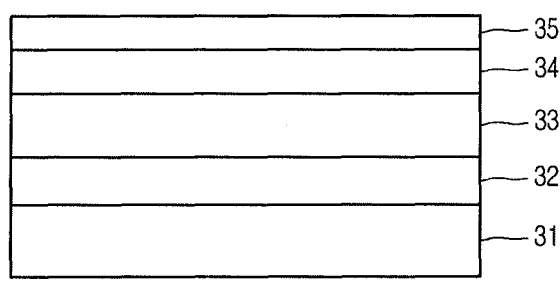
FIGS. 4 to 11 are views illustrating a process of fabricating the semiconductor light emitting device according to the present invention.

In the method for fabricating the semiconductor light emitting device according to the present invention, as illustrated in FIG. 4, a buffer layer 32, an n-type cladding layer 33, an active layer 34, and a p-type cladding layer 35 are stacked on a substrate 31. The buffer layer 32 may be excluded, but is formed as one of methods to improve characteristics of the semiconductor layer. The n-type cladding layer 33 may be an n-GaN cladding layer, and the p-type cladding layer 35 may be a p-GaN cladding layer.

Figure 5:
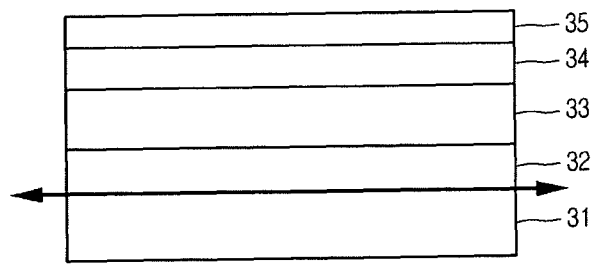

Then, as illustrated in FIG. 5, the substrate 31 is removed from the resulting structure. The substrate 31 may be separated and removed by a laser lift-off method. In the laser lift-off method, an eximer laser may be used to separate and remove the substrate 31.

Figure 6:
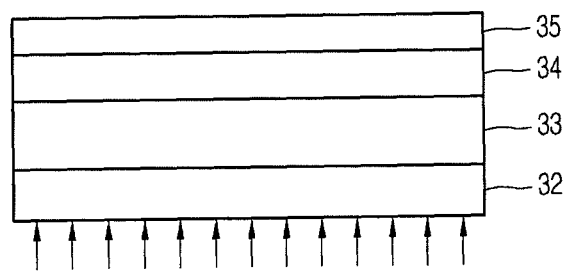
Figure 7:
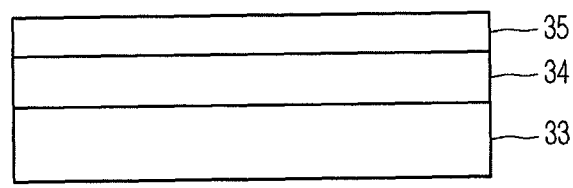

As illustrated in FIGS. 6 and 7, the buffer layer 32 is removed to expose the n-type cladding layer 33. Chemical mechanical polishing or etching may be performed to remove the buffer layer 32 and expose the n-type cladding layer 33.

Figure 8:
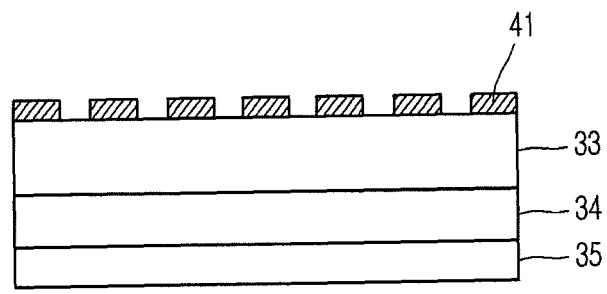
Figure 9:
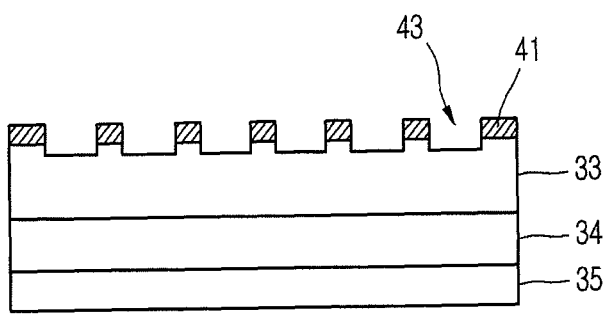

As illustrated in FIG. 8, a photoresist layer 41 is formed on the n-type cladding layer 33, and patterning is performed thereon. Then, the patterned photoresist layer 41 is etched to form uneven patterns 43 in the n-type cladding layer 33. The uneven patterns 43 of the n-type cladding layer 33 may be formed at regular intervals or different intervals.

Figure 10:
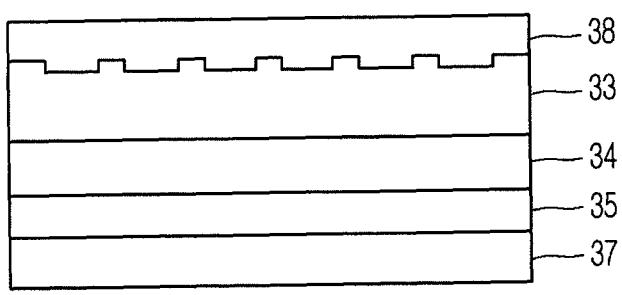

Then, the photoresist layer 41 is removed. As illustrated in FIG. 10, an n-type electrode 38 is formed on the n-type cladding layer 33 where the uneven patterns are formed, and a p-type electrode 37 is formed on the p-type cladding layer 35. The n-type electrode 38 may be formed over the entire surface of the n-type cladding layer 33, and the p-type electrode 37 may be formed over the entire surface of the p-type cladding layer 35. Preferably, one of the n-type electrode 38 and the p-type electrode 37 formed over the entire surfaces is formed as a transparent electrode. As illustrated in FIG. 3, a p-type contact layer 36 may be further formed between the p-type cladding layer 35 and the p-type electrode 37.

Figure 11:
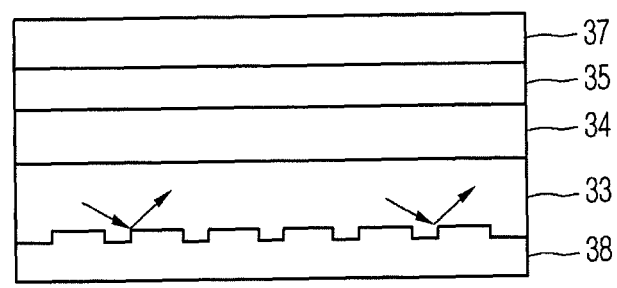

As illustrated in FIG. 11, in the semiconductor light emitting device fabricated in the aforementioned manner, light propagating in the horizontal direction is scattered or diffracted in the region of the n-type cladding layer 33 where the uneven patterns 43 are formed. Accordingly, the external quantum efficiency of the semiconductor light emitting device according to the present invention can be improved to a great extent.

Also, in the semiconductor light emitting device according to the present invention, the p-type electrode 37 and the n-type electrode 38 are stacked parallel at the upper and lower parts thereof. Thus, the current density is not concentrated in a specific region, but is evenly distributed over the entire region corresponding to the n-type electrode 38. Accordingly, the current crowding is prevented from occurring at a specific portion of the n-type electrode 38, so that a drastic increase in temperature in the specific region can be prevented from occurring.

In addition, because the two electrodes are placed at a sufficient distance therebetween in the semiconductor light emitting device according to the present invention, the device can be proof against the static electricity. The thermal dissipation property of the semiconductor light emitting device may also be improved through a method of attaching the device to a heat sink or the like.

Figure 12:
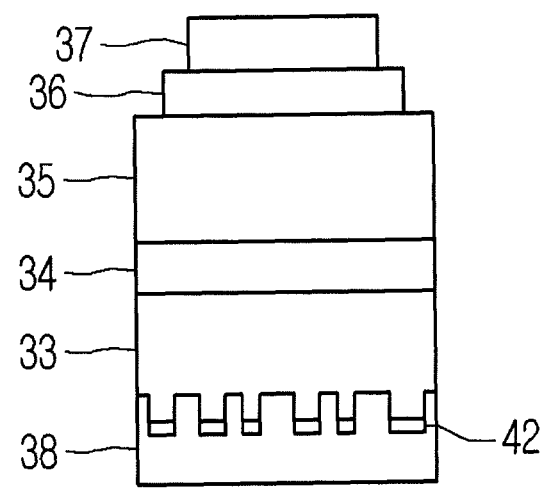
FIG. 12 is a schematic view showing another structure of the semiconductor light emitting device according to the present invention.

Although in the present embodiment, the case where the buffer layer 32 is removed to expose the n-type cladding layer 33 is described, the buffer layer 32 may not be completely removed. That is, as shown in FIG. 12, uneven patterns may be formed in both the buffer layer 42 and the n-type cladding layer 33 through etching, and the n-type electrode 38 may be formed thereon. The buffer layer 32 may be formed of a conductive material. FIG. 12 is a schematic view showing another structure of the semiconductor light emitting device according to the present invention.

Figure 13:
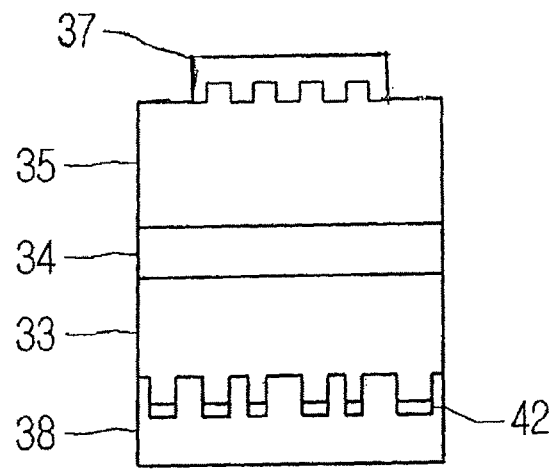
FIG. 13 is a schematic view of the semiconductor light emitting device having a periodic uneven pattern formed in the p-type cladding layer according to an embodiment of the present invention.
Figure 14:
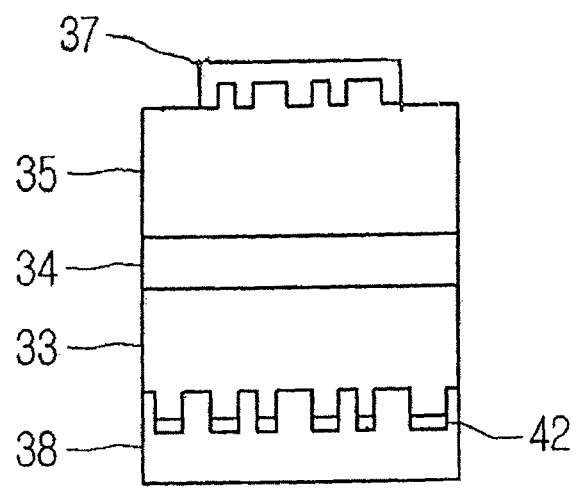
FIG. 14 is a schematic view of the semiconductor light emitting device having a non-periodic uneven pattern formed in the p-type cladding layer according to an embodiment of the present invention.

In the present embodiment, the uneven patterns are formed in the n-type cladding layer 33, and the n-type electrode 38 is formed on the surface where the uneven patterns are formed. However, the present invention is not limited thereto, and such uneven patterns may be formed in the p-type cladding layer 35. Examples of semiconductor light emitting devices having uneven patterns formed in the p-type cladding layer 35 are seen in FIGS. 13 and 14. In FIG. 13, the uneven pattern is periodic and in FIG. 14, the uneven patterns are non-periodic.

In the present embodiment, the semiconductor light emitting device of a p-n junction structure is described as an example, in which the p-type semiconductor layer is formed at an upper part and the n-type semiconductor layer is formed at a lower part. However, the semiconductor light emitting device may have an n-p-n junction structure where an n-type semiconductor layer is further formed on the p-type semiconductor layer. The n-p-n junction structure means that a first electrode layer and a second electrode layer are all formed as n-type semiconductor layers, and a p-type semiconductor layer is formed therebetween. A first electrode is formed on the first electrode layer, the n-type semiconductor layer, and the second electrode is formed on the second electrode layer, the n-type semiconductor layer.

According to the semiconductor light emitting device and the fabrication method thereof, the external quantum efficiency and the thermal dissipation can be improved.

What is claimed is:

1. A semiconductor light emitting device, comprising:
a top layer having a top surface and a bottom surface, the top layer being an n electrode;
an uneven pattern formed in the bottom surface of the n electrode;
a GaN based n-type semiconductor layer formed under the n electrode, the GaN based n-type semiconductor layer having a top surface and a bottom surface;
an uneven pattern formed in the top surface of the GaN based n-type semiconductor layer, the uneven pattern of the GaN based n-type semiconductor layer directly physically contacting the uneven pattern of the n electrode;
an active layer formed under the GaN based n-type semiconductor layer;
a GaN based p-type semiconductor layer formed under the active layer; and
a p electrode formed under the GaN based p-type semiconductor layer,
wherein a light emitting structure including the GaN based n-type semiconductor layer, the active layer, and the GaN based p-type semiconductor layer generates light,
wherein a top surface of the light emitting structure directly contacts the n electrode,
wherein the GaN based n-type semiconductor layer only includes GaN based semiconductor materials,
wherein the uneven pattern formed in the top surface of the GaN based n-type semiconductor layer is directly formed in the GaN based n-type semiconductor layer,
wherein the uneven pattern formed in the top surface of the GaN based n-type semiconductor layer is formed at different intervals,
wherein at least the n electrode is formed over the entire top surface of the GaN based n-type semiconductor layer, or at least the p electrode is formed over the entire surface of the GaN based p-type semiconductor layer,
wherein an entire surface of the n electrode contacts the GaN based n-type semiconductor layer, wherein a width of the top surface of the top layer and a width of the bottom surface of the top layer are the same, and wherein a growing substrate is not disposed between the n electrode and the p electrode.

2. The semiconductor light emitting device of claim 1, wherein the uneven pattern of the n electrode extends across an entire boundary between the n electrode and the GaN based n-type semiconductor layer.

3. The semiconductor light emitting device of claim 1, wherein the GaN based p-type semiconductor layer is transparent.

4. The semiconductor light emitting device of claim 1, wherein the active layer has a multi-quantum well structure.

5. The semiconductor light emitting device of claim 1, further comprising a p-contact semiconductor layer between the GaN based p-type semiconductor layer and the p electrode.

6. The semiconductor light emitting device of claim 1, further comprising an uneven pattern in the GaN based p-type semiconductor layer contacting the p electrode.

7. The semiconductor light emitting device of claim 6, wherein the uneven pattern in the GaN based p-type semiconductor layer is periodic.

8. The semiconductor light emitting device of claim 6, wherein the uneven pattern in the GaN based p-type semiconductor layer is non-periodic.

\* \* \* \* \*